(12) United States Patent
Houston et al.

(10) Patent No.: US 6,768,144 B2
(45) Date of Patent: Jul. 27, 2004

(54) METHOD AND APPARATUS FOR REDUCING LEAKAGE CURRENT IN AN SRAM ARRAY

(75) Inventors: Theodore W. Houston, Richardson, TX (US); Sudhir K. Madan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/039,124

(22) Filed: Dec. 31, 2001

(65) Prior Publication Data

US 2003/0122160 A1 Jul. 3, 2003

(51) Int. Cl.[7] .............................................. H01L 27/10
(52) U.S. Cl. ........................ 257/207; 257/204; 257/208
(58) Field of Search ................................ 257/204–208, 257/499, 544, E27.098, E27.099, 905–908, 400, 207, 288, 296–7; 438/128–129, 218–219, 293, 353, 400; 365/182, E27.098, E27.099

(56) References Cited

U.S. PATENT DOCUMENTS

| | | | | |
|---|---|---|---|---|
| 5,281,842 A | * | 1/1994 | Yasuda et al. | 257/371 |
| 6,018,172 A | * | 1/2000 | Hidaka et al. | 257/296 |
| 6,104,061 A | * | 8/2000 | Forbes et al. | 257/330 |
| 6,218,895 B1 | * | 4/2001 | De et al. | 327/566 |
| 6,337,805 B1 | * | 1/2002 | Forbes et al. | 365/145 |
| 6,420,744 B1 | * | 7/2002 | Kim et al. | 257/295 |

OTHER PUBLICATIONS

McGraw–Hill Dictionary of Scientific and Technical Terms, Fifth Edition, Ed. S. P. Parker, McGraw–Hill, Inc., New York 1993.*

S. Wolf, "Silicon Processing for the VLSI ERa", Vol. 2—Process Integration, Lattice Press, Sunset Beach, CA(USA), 1990 (ISBN 0–961672–4–5); pp. 368–373.*

A. Keshavarzi et al., "Technology Scaling Behavior of Optimum Reverse Body Bias for Standby Leakage Power Reduction in CMOS IC's", in Conference Proceedings of "Low Power Electronics and Design" Aug. 16–17, 1999; pp. 252–254 (ISBN: 1–58113–133–X).*

David B. Scott patent application Ser. No. 09/999,361 filed Nov. 25, 2001.

* cited by examiner

*Primary Examiner*—Nathan J. Flynn
*Assistant Examiner*—Johannes Mondt
(74) *Attorney, Agent, or Firm*—Peter K. McLarty; W. James Brady, III; Frederick J. Telecky, Jr.

(57) ABSTRACT

A memory array including a bit cell row, a strap cell row, a first power supply line, and a first offset supply line is provided. The bit cell row may include a bit cell that includes a first transistor disposed in a first bit cell body region. The first transistor may include a first active region. The strap cell row may include a strap cell that includes a first strap cell body region. The first strap cell body region may be conductively coupled to the first bit cell body region. The first power supply line may be electrically coupled to the first active region and may provide a first supply voltage potential to the first active region. The first offset supply line may be electrically coupled to the first strap cell body region and may provide a first offset voltage potential to the first bit cell body region via the first strap cell body region. The first supply voltage potential is operable to be different from the first offset voltage potential.

36 Claims, 7 Drawing Sheets

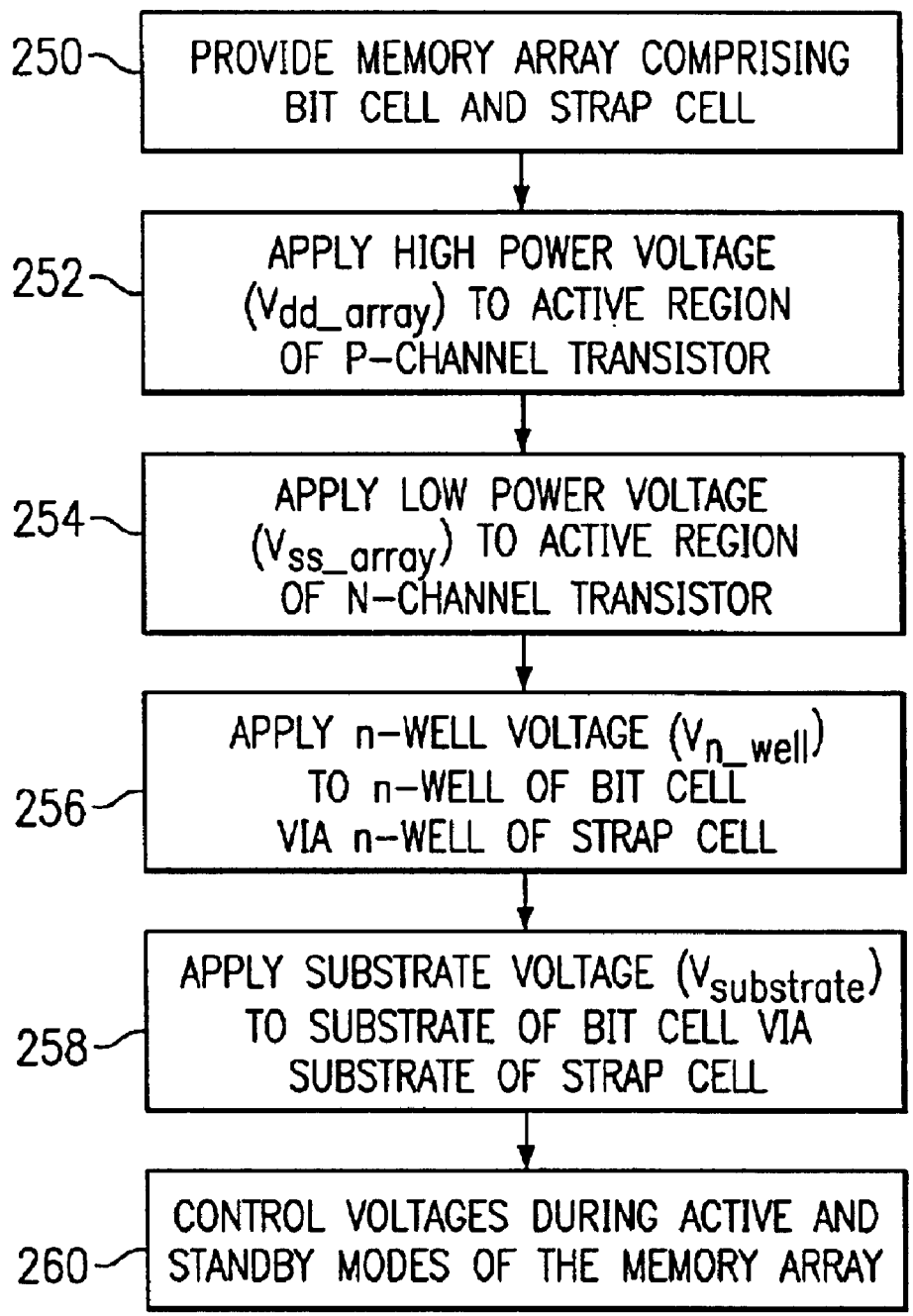

METHOD AND APPARATUS FOR REDUCING LEAKAGE CURRENT IN AN SRAM ARRAY

TECHNICAL FIELD OF THE INVENTION

This invention relates in general to memory arrays and, more particularly, to a method and apparatus for reducing leakage current in an SRAM array.

BACKGROUND OF THE INVENTION

Modern electronic equipment, such as televisions, telephones, radios, and computers are generally constructed of solid state devices. Solid state devices include transistors, capacitors, resistors, and other semiconductor devices. Typically, such devices are fabricated on a substrate and interconnected to form memory arrays, logic structures, timers, and other components of an integrated circuit. One type of memory array is a static random access memory (SRAM) in which memory cells are continuously available for reading and writing data. As technology improves, SRAM cells and other components are fabricated at smaller sizes and with greater on-chip integration.

The increasing level of on-chip integration has allowed steady improvements in modern microprocessor performance, but has also resulted in high energy dissipation in integrated circuits. In complementary metal-oxide-silicone (CMOS) circuits, high transistor-switching speeds can be achieved by reducing the supply voltage, which proportionately reduces the transistor threshold voltage. However, decreasing the transistor threshold voltage may increase the amount of "static" or "leakage" power dissipated by the CMOS circuit. As transistor threshold voltages continue to be reduced in emerging technologies, leakage power is becoming a sizable percentage of the total power consumed in CMOS circuits.

SUMMARY OF THE INVENTION

In accordance with the present invention, a method and apparatus for reducing leakage current in an SRAM array are provided that substantially eliminate or reduce the disadvantages and problems associated with previously developed methods and apparatuses.

According to one embodiment, a memory array including a bit cell row, a strap cell row, a first power supply line, and a first offset supply line is provided. The bit cell row includes a bit cell that includes a first transistor disposed in a first bit cell body region. The first transistor includes a first active region. The strap cell row includes a strap cell that includes a first strap cell body region. The first strap cell body region is conductively coupled to the first bit cell body region. The first power supply line is electrically coupled to the first active region and provides a first supply voltage potential to the first active region. The first offset supply line is electrically coupled to the first strap cell body region and provides a first offset voltage potential to the first bit cell body region via the first strap cell body region. The first supply voltage potential is operable to be different from the first offset voltage potential.

According to another embodiment, a method of reducing memory array leakage current is provided. The method includes providing a memory array including a bit cell and a strap cell. The bit cell includes a first transistor disposed in a first bit cell body region. The first transistor includes a first active region. The strap cell includes a first strap cell body region that is conductively coupled to the first bit cell body region. The method further includes applying a first supply voltage potential to the first active region. The method further includes applying a first offset voltage potential to the first bit cell body region via the first strap cell body region. The first supply voltage potential is operable to be different from the first offset voltage potential.

Various embodiments of the present invention may benefit from numerous technical advantages. It should be noted that one or more embodiments may benefit from some, none, or all of the advantages discussed below.

One technical advantage of the invention is that leakage current in a memory array may be reduced by increasing the low power supply voltage applied to the source of a transistor in the memory cell with respect to a substrate supply voltage applied to the substrate of the memory cell, and/or decreasing the high power supply voltage applied to the source of another transistor in the memory cell with respect to an n-well supply voltage applied to the n-well of the memory cell. In particular, the low and high power supply voltages may be maintained or controlled separately from the substrate and n-well supply voltages, respectively.

Another technical advantage is that the low and high power supply voltages applied to the memory array may be maintained or controlled separately from the low and high power supply voltages applied to a peripheral circuit, such as a logic circuit.

Another technical advantage is that one or more of the voltages applied to the memory array may be controlled during different modes of the memory array or particular bit cells, including a standby mode and an active mode, in order to control or to maximize the reduction of leakage current in the memory array.

Another technical advantage is that a strap cell having a structure that substantially mimics or emulates the structure of surrounding bit cells in the memory array may be used to provide the substrate and n-well supply voltages separate from the low and high power supply voltages applied to the memory array. This provides the advantage of more uniform patterning and processing of bit cells adjacent to the strap cell.

Another technical advantage is that the layout of the memory array allows a relatively wide spacing of strap cell rows, which may reduce the cost of including strap cells in a memory array.

Another technical advantage is that the well voltages within the memory array, including for example the n-well and substrate voltages, may be controlled such that latch-up and cell upsets may be reduced or minimized.

Other technical advantages will be readily apparent to one skilled in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which:

FIG. 6 illustrates a method of reducing leakage current in a memory array in accordance with an embodiment of the present invention.

DETAILED DESCRIPTION OF THE DRAWINGS

Figure 1:
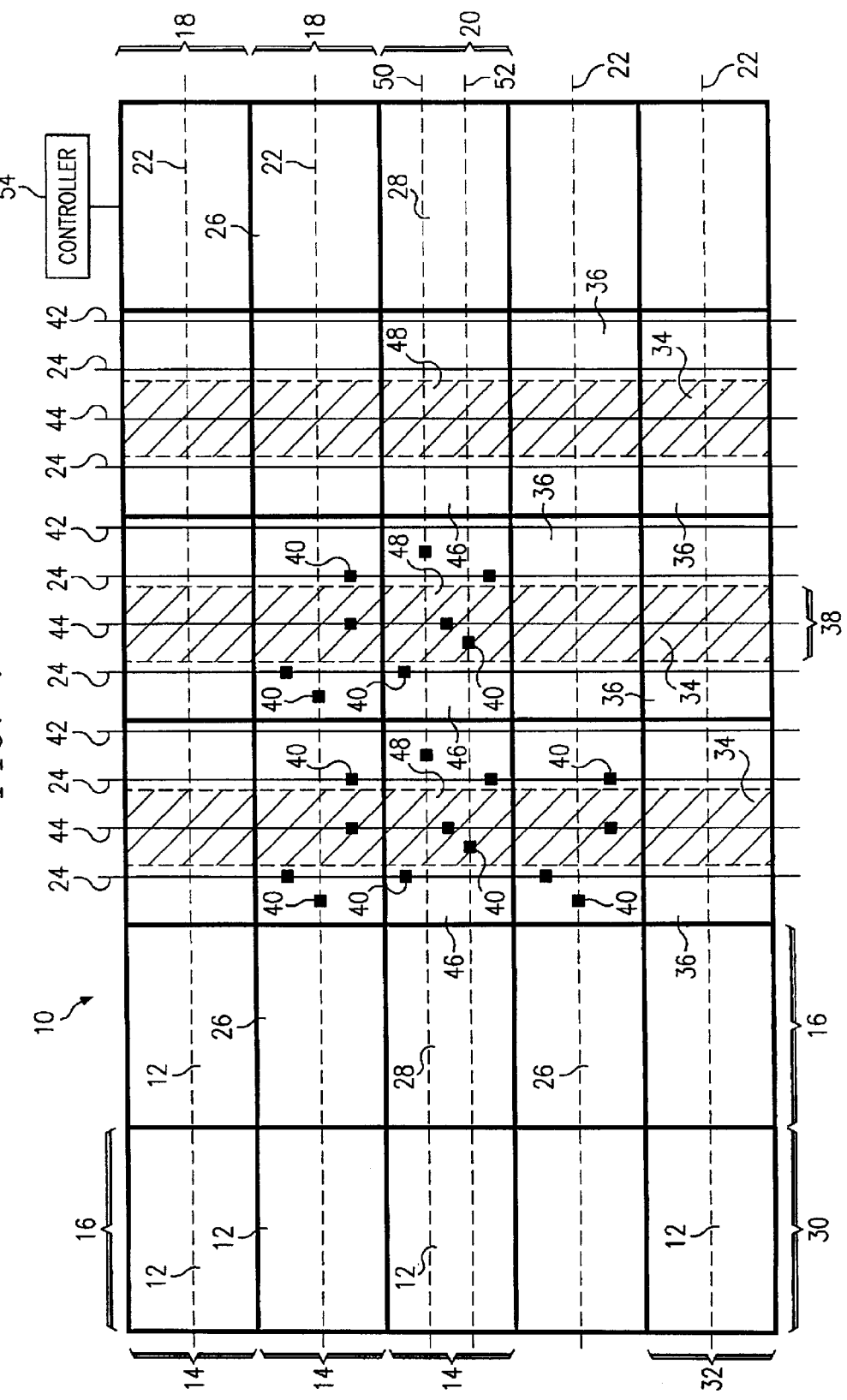
FIG. 1 is a top plan view of a memory array in accordance with an embodiment of the present invention.

FIG. 1 is a top plan view of a memory array 10 in accordance with an embodiment of the present invention. Memory array 10 includes a plurality of cells 12 arranged in one or more cell rows 14 and one or more cell columns 16. Cell rows 14 include a plurality of bit cell rows 18 and one or more strap cell rows 20. Memory array 10 further includes a plurality of word lines 22 and a plurality of bit lines 24 coupled to cells 12 via a plurality of contacts as discussed below. Memory array 10 may be an SRAM array, such as, for example, a six-transistor or a four-transistor SRAM array. However, it should be noted that memory array 10 may be a RAM, ROM, PROM, EPROM, EPROM/Flash, or DRAM array, or any other type of memory array without departing from the present invention.

Each bit cell row 18 includes a plurality of bit cells 26, and each strap cell row 20 includes a plurality of strap cells 28. For purposes of illustration, one cell 12 of memory array 10 is shown in FIG. 1 as being defined by a width 30 and a depth 32. Thus, as shown for example in FIG. 1, each bit cell row 18 and strap cell row 20 includes six bit cells 26 and six strap cells 28, respectively. Each bit cell 26 and each strap cell 28 includes one or more body regions, such as n-well and substrate regions. For example, in the embodiment shown in FIG. 1, each bit cell 26 includes an n-well region 34 formed in a substrate region, 36. N-well region 34 may be formed from n-type silicon, and substrate region 36 may be formed from p-type silicon. The n-well regions 34 of adjacent cells 12 in each cell column 16 may be coupled to form an n-well column 38 associated with each cell column 16.

Each bit cell 26 also includes one or more circuit components, such as for example, transistors, capacitors, or resistors. In an embodiment in which memory array 10 is a six-transistor SRAM array, each bit cell 26 includes six transistors (not expressly shown in FIG. 1). In this embodiment, two p-channel load transistors are disposed in n-well region 34 and four n-channel transistors, including two drive transistors and two pass-gate transistors, are disposed in substrate region 36. The drive and load transistors form two inverters, wherein the output of each inverter is the input to the other inverter. The two pass-gate transistors are gated, or coupled, by one of the word lines 22 and each pass-gate transistor communicates the output of one of the inverters to one of the bit lines 24. Thus, in this embodiment, one word line 22 and two bit lines 24 are associated with each bit cell 26. Word lines 22 and bit lines 24 are coupled to the various transistors of bit cells 26 by conductive contacts 40, which may include various types of electrically conductive contacts such as, for example, metal interconnects or vias.

Memory array 10 further includes a plurality of low power supply lines 42 and high power supply lines 44 coupled to cells 12 via conductive contacts 40. Low power supply line 42 supplies a low power voltage potential ($V_{ss\_array}$) to memory array 10, while high power supply line 44 supplies a high power voltage potential ($V_{dd\_array}$) to memory array 10. In one embodiment, low power supply line 42 supplies a low power voltage potential ($V_{ss\_array}$) to an active source region of at least one n-channel transistor in each bit cell 26, while high power supply line 44 supplies a high power voltage potential ($V_{dd\_array}$) to an active source region of at least one p-channel transistor in each bit cell 26. In addition, memory array 10 may be disposed in a logic circuit or some other peripheral circuit that has a low power supply voltage ($V_{ss\_peripheral}$) and a high power supply voltage ($V_{dd\_peripheral}$). In one embodiment, $V_{ss\_array}$ and $V_{dd\_array}$ are substantially the same as $V_{ss\_peripheral}$ and $V_{dd\_peripheral}$, respectively. In some embodiments, $V_{ss\_array}$ and/or $V_{dd\_array}$ may be separate and different from $V_{ss\_peripheral}$ and/or $V_{dd\_peripheral}$, as discussed in greater detail below with reference to FIGS. 2 and 3.

Strap cell rows 20 may be disposed in memory array 10 such that each strap cell row 20 is adjacent at least one bit cell row 18. In the embodiment shown in FIG. 1, n-well columns 38 run generally parallel to bit lines 24, which allows a relatively wide spacing of strap cell rows 20, which may reduce the cost of including strap cells in a memory array. For example, strap cell rows 20 may be disposed in memory array 10 at every 64 to 72 rows of memory array 10. In other words, in this embodiment, strap cell row 20 may be spaced such that consecutive strap cell rows 20 are separated by 64 to 72 bit cell rows 18.

Each strap cell 28 may include a substrate region 46 and an n-well region 48 formed in substrate region 46. Strap cells 28 may "mimic," or in other words have a substantially similar structure to, bit cells 26. In particular, strap cells 28 may have substantially similar dimensions, such as cell width, depth and height, as bit cells 26. In one embodiment, strap cells 28 and bit cells 26 have a substantially similar structure for processing and optical reasons, such as for optical proximity correction. Regarding processing, the densities of geometries being etched influences etch rates, and an isolated structure may etch differently than a structural array. Thus, greater uniformity among bit cells and strap cells in a memory array results in a higher quality manufacture. Regarding optics, with small geometries there may be scattering of light around regions being patterned, and thus exposure of one pattern may affect other patterns. Due to this phenomenon, if the structure of a strap cell is different than that of a neighboring bit cell, the formation of transistors in the neighboring bit cell may be affected in an undesired manner.

One or more offset, or well, voltage supply lines may be coupled to strap cells 12 via conductive contacts 40. In one embodiment, memory array 10 includes a substrate power supply line 50 which applies a substrate voltage potential ($V_{substrate}$) to substrate region 46, and an n-well power supply line 52 which applies an n-well voltage potential ($V_{n-well}$) to n-well region 48. Since each strap cell row 20 is adjacent one or more bit cell rows 18, substrate region 46 and n-well region 48 of each strap cell 28 may be conductively coupled to substrate region 36 and n-well region 34 of one or more bit cells 26. Thus, the substrate voltage potential ($V_{substrate}$) may propagate from substrate regions 46 of strap cells 28 to substrate regions 36 of neighboring bit cells 26. Similarly, the n-well voltage potential ($V_{n\text{-}well}$) may propagate from n-well regions 48 of strap cells 28 to n-well regions 34 of neighboring bit cells 26, and so on, along each n-well column 38.

In one embodiment, the substrate voltage potential ($V_{substrate}$) is offset from the low power voltage potential ($V_{ss\_array}$), and the n-well voltage potential ($V_{n\text{-}well}$) is offset from the high power voltage potential ($V_{dd\_array}$). Thus, $V_{substrate}$ and $V_{n\text{-}well}$ may be referred to as offset, or well, voltages. In this manner, as many as four different voltages ($V_{ss\_array}$, $V_{dd\_array}$, $V_{substrate}$, and $V_{n\text{-}well}$) may be maintained separately, and isolated from each other, in each bit cell 26. This is discussed in greater detail below with reference to FIG. 2.

One or more controllers 54 may be used to control the various supply voltages ($V_{ss\_array}$, $V_{dd\_array}$, $V_{substrate}$, and $V_{n\text{-}well}$) such as to achieve desired relationships between the voltages during one more modes of bit cell 26 or memory array 10, such as a standby mode and an active mode. In one embodiment, one or more of the various supply voltages are controlled by an external input using one or more controllers 54 coupled to memory array 10, as shown in FIG. 1. In another embodiment (not expressly shown), memory array 10 includes one or more such controllers 54. Controllers 54 may include any suitable hardware and/or software for controlling one or more of the various voltages, for example as described below with respect to FIG. 3, without departing from the scope of the present invention.

Figure 2:
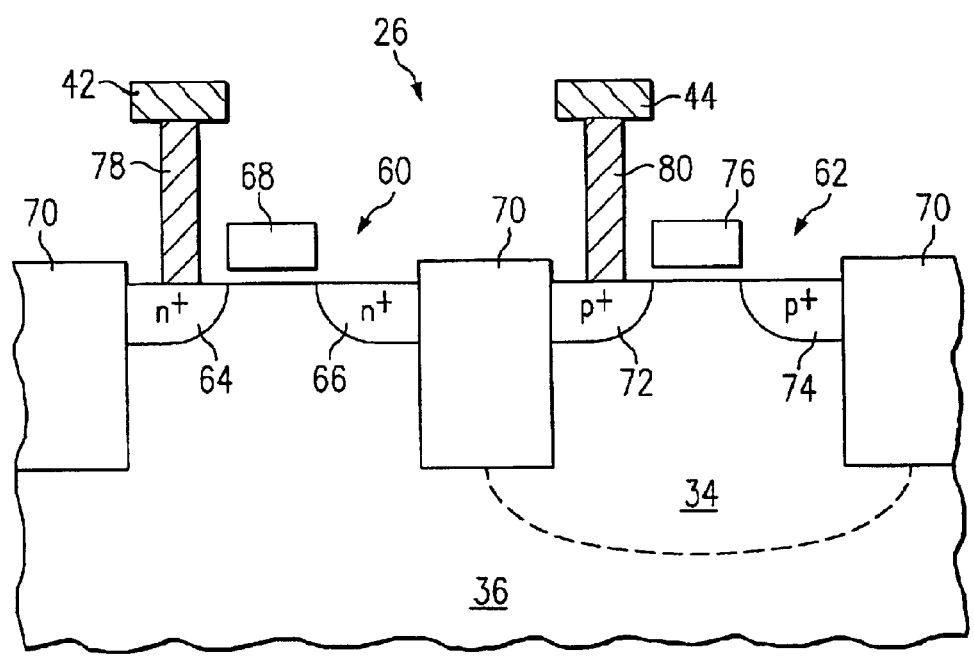
FIG. 2 is a diagrammatic, cross-sectional, side view of a portion of a bit cell in accordance with an embodiment of the present invention.

FIG. 2 is a diagrammatic, cross-sectional, side view of a portion of a bit cell in accordance with an embodiment of the present invention. As discussed above, each bit cell 26 may include a plurality (for example, four or six) of transistors. FIG. 2 illustrates a cross-section of an n-channel transistor 60 and a p-channel transistor 62 disposed in a particular bit cell 26.

It should be noted that FIG. 2 is only an illustrative representation of an n-channel transistor and a p-channel transistor in a bit cell, and that the transistors in bit cell 26 may be otherwise oriented or positioned. In particular, in the embodiment shown in FIGS. 4 and 4a, the n-channel and p-channel transistors in bit cell 26 are not aligned side-by-side as shown in FIG. 2.

According to FIG. 2, n-channel transistor 60 is disposed in substrate region 36, and may include an n-channel source 64 and an n-channel drain 66 formed by known doping methods, and a gate 68. A conductive power supply contact 78 may couple n-channel source 64 with low power supply line 42 providing an electrical path for low power supply line 42 to apply the low power voltage potential ($V_{ss\_array}$) to n-channel source 64.

P-channel transistor 62 is disposed in n-well region 34, which may be an n-type well formed within substrate region 36. In addition, n-channel transistor 60 and p-channel transistor 62 may be separated by one or more non-conducive isolation regions 70. P-channel transistor 62 may include a p-channel source 72 and a p-channel drain 74 formed by known doping methods, and a gate 76. A conductive power supply contact 80 may couple p-channel source 72 with high power supply line 44 providing an electrical path for high power supply line 44 to apply the high power voltage potential ($V_{dd\_array}$) to p-channel source 72.

Figure 3:
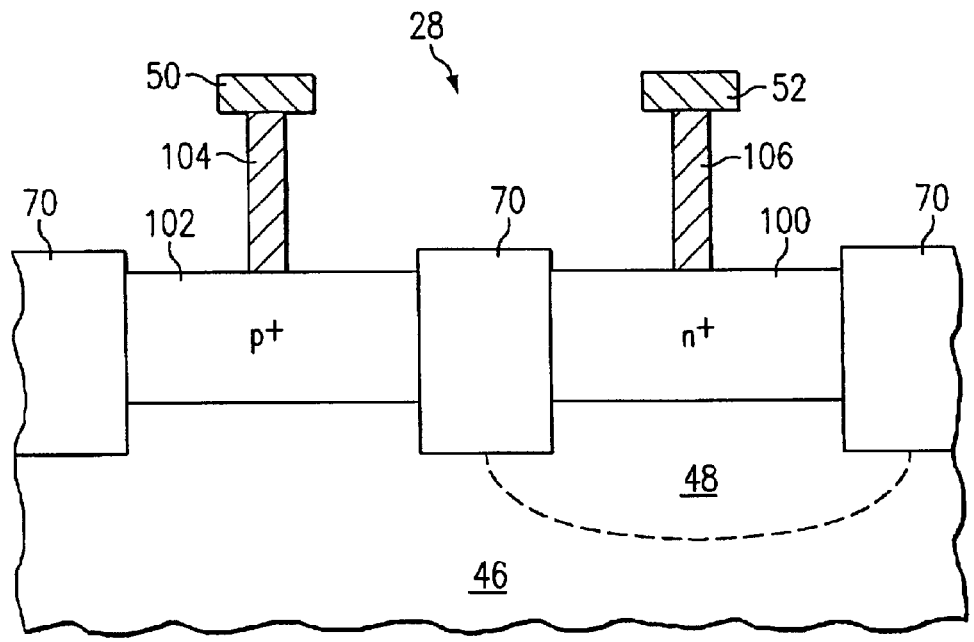
FIG. 3 is a diagrammatic, cross-sectional, side view of a portion of a strap cell adjacent the bit cell shown in FIG. 2 in accordance with an embodiment of the present invention.

FIG. 3 is a diagrammatic, cross-sectional, side view of a portion of a strap cell 28 adjacent the bit cell 26 shown in FIG. 2 in accordance with an embodiment of the present invention. As discussed above, substrate region 46 and n-well region 48 of strap cell 28 may be coupled to substrate region 36 and n-well region 34 of one or more adjacent bit cells 26, such as for example bit cell 26 shown in FIG. 2.

It should be noted that FIG. 3 is only an illustrative representation of a portion of a strap cell, and that the components of the strap cell may be otherwise sized, spaced, or configured. In particular, in the embodiment shown in FIGS. 5 and 5a, the two contact regions (specified below as n-well contact region 100 and substrate contact region 102) in strap cell 28 are not in the same proportion as shown in FIG. 3.

In one embodiment, strap cell 28 does not include transistors. An n-well contact region 100 may be disposed in n-well region 48 where p-channel transistor 62 is located in bit cell 26. N-well contact region 100 may comprise an $n^+$ implant. Similarly, a substrate contact region 102 may be disposed in substrate region 46 where n-channel transistor 60 is located in bit cell 26. Substrate contact region 102 may comprise a $p^+$ implant.

A conductive substrate supply contact 104 may couple substrate region 46 (in particular, substrate contact region 102) with substrate power supply line 50, thereby providing an electrical path for substrate power supply line 50 to apply the substrate voltage potential ($V_{substrate}$) to substrate region 46. Similarly, a conductive n-well supply contact 106 may couple n-well region 48 (in particular, n-well contact region 100) with n-well power supply line 52, thereby providing an electrical path for n-well power supply line 52 to apply the n-well voltage potential ($V_{n\text{-}well}$) to n-well region 48.

As discussed above with reference to FIG. 1, since substrate region 46 may be coupled to substrate region 36 of adjacent bit cell 26 shown in FIG. 2, the substrate voltage potential ($V_{substrate}$) may propagate from substrate power supply line 50 to substrate region 46 to substrate region 36 of bit cell 26. Similarly, since n-well region 48 may be coupled to n-well region 34 of adjacent bit cell 26 shown in FIG. 2, the n-well voltage potential ($V_{n\text{-}well}$) may propagate from n-well power supply line 52 to n-well region 48 to n-well region 34 of bit cell 26.

Thus, in the embodiment shown in FIG. 2, bit cell 26 may maintain up to four voltages ($V_{ss\_array}$, $V_{dd\_array}$, $V_{substrate}$, and $V_{n\text{-}well}$), each separate and isolated from the other voltages. In one embodiment, one well voltage, $V_{substrate}$ or $V_{n\text{-}well}$, is applied to bit cell 26, while in another embodiment, both well voltages, $V_{substrate}$ and $V_{n\text{-}well}$, are applied to bit cell 26. Leakage energy dissipation, or leakage current (which may be referred to as quiescent current, or IDDQ), associated with memory array 10 may be decreased generally by reducing the voltage across memory array 10. For example, the voltage across memory array may be reduced by lowering $V_{dd\_array}$ with respect to $V_{ss\_array}$ and/or raising $V_{ss\_array}$ with respect to $V_{dd\_array}$. In addition, leakage current may be further reduced by selecting or controlling the relationship between $V_{ss\_array}$ and $V_{substrate}$ and/or the relationship between $V_{dd\_array}$ and $V_{n\text{-}well}$, as discussed below.

As discussed above with reference to FIG. 1, memory array 10 may be disposed in a logic circuit and $V_{ss\_array}$ and $V_{dd\_array}$ may be substantially the same as the low and high power supplies applied to the peripheral circuit, namely $V_{ss\_peripheral}$ and $V_{dd\_peripheral}$, respectively. In some embodiments, $V_{ss\_array}$ and $V_{dd\_array}$ may be controlled separately from $V_{ssperipheral}$ and $V_{dd\_peripheral}$. In one embodiment, $V_{ss\_array}$ and $V_{dd\_array}$, are only temporarily different from $V_{ss\_peripheral}$ and $V_{dd\_peripheral}$, respectively. In particular, $V_{ss\_array}$ and $V_{dd\_array}$ may be different from $V_{ss\_peripheral}$ and $V_{dd\_peripheral}$, respectively, when bit cell 26 (or memory array 10) is in a standby (or inactive) mode, but not when bit cell 26 is in an active (or operational) mode. For example, it may be desirable to maintain $V_{ss\_array}$ and $V_{dd\_array}$ equal to $V_{ss\_peripheral}$ and $V_{dd\_peripheral}$, respectively, during an active mode in order to obtain a desired performance or output from memory array 10. It may be less important to maintain $V_{ss\_array}$ and $V_{dd\_array}$ equal to $V_{ss\_peripheral}$ and $V_{dd\_peripheral}$, respectively, during a standby mode since a particular read current is not required, and the probability of a cell upset is lower when the cell is not being accessed. In particular, it may be desirable to reduce the voltage across memory array 10 by increasing $V_{ss\_array}$ and/or decreasing $V_{dd\_array}$ during the standby mode in order to reduce leakage current in memory array 10.

In addition, the well voltages ($V_{substrate}$ or $V_{n\text{-}well}$) may be different than the power supply voltages ($V_{ss\_array}$ or $V_{dd\_array}$) applied to the transistor disposed within the well regions at least during the standby mode of bit cell 26 (or memory array 10). For example, $V_{substrate}$ may be different than $V_{ss\_array}$ and $V_{n\text{-}well}$ may be different from $V_{dd\_array}$ in bit cell 26. These voltage relationships may be selected or controlled in order to produce a desired back bias on the transistors in bit cell 26, which may provide desired threshold voltages ($V_{th}$) which may reduce leakage energy dissipation, or leakage current, in memory array 10.

For example, in one embodiment, $V_{substrate}$ is less than $V_{ss\_array}$, which results in a different back bias of n-channel transistor than if $V_{substrate}$ was equal to $V_{ss\_array}$. This back bias may provide a higher threshold voltage ($V_{th}$) of n-channel transistor 60 than if $V_{substrate}$ were equal to $V_{ss\_array}$, which may result in decreased leakage current associated with n-channel transistor 60. In another embodiment, $V_{n\text{-}well}$ is greater than $V_{dd\_array}$, which results in a different back bias of p-channel transistor 62 than if $V_{n\text{-}well}$ were equal to $V_{ss\_array}$. This back bias may provide a higher threshold voltage ($V_{th}$) of p-channel transistor 62 than if $V_{n\text{-}well}$ were equal to $V_{dd\_array}$, which may result in decreased leakage current associated with p-channel transistor 62. In another embodiment, $V_{substrate}$ is less than $V_{ss\_array}$ and $V_{n\text{-}well}$ is greater than $V_{dd\_array}$.

In one embodiment, the well voltages $V_{substrate}$ and $V_{n\text{-}well}$ are maintained substantially the same as the low and high peripheral circuit supply voltages $V_{ss\_peripheral}$ and $V_{dd\_peripheral}$, respectively, at least during the standby mode of bit cell 26 (or memory array 10). In this embodiment, the power supply voltages $V_{ss\_array}$ and $V_{dd\_array}$ may be maintained and controlled separately from the well voltages $V_{substrate}$ and $V_{n\text{-}well}$, respectively.

Power supply voltages, $V_{ss\_array}$ and $V_{dd\_array}$, may be only temporarily different from their respective well voltages, $V_{substrate}$ and $V_{n\text{-}well}$. In particular, power supply voltages may be different from their respective well voltages when bit cell 26 (or memory array 10) is in a standby (or inactive) mode, but not when bit cell 26 is in an active (or operational) mode. For example, it may be desirable to maintain $V_{ss\_array}$ and $V_{dd\_array}$ equal to $V_{substrate}$ and $V_{n\text{-}well}$, respectively, or to maintain $V_{ss\_array}$ and $V_{dd\_array}$ equal to $V_{ss\_peripheral}$ and $V_{dd\_peripheral}$, respectively, during an active mode in order to obtain a desired performance or output from memory array 10. It may be less important to maintain $V_{ss\_array}$ and $V_{dd\_array}$ equal to $V_{substrate}$ and $V_{n\text{-}well}$, respectively, or to maintain $V_{ss\_array}$ and $V_{dd\_array}$ equal to $V_{ss\_peripheral}$ and $V_{dd\_peripheral}$, respectively, during a standby mode since a particular read current is not required and the cell is more stable when it is not being accessed. In particular, it may be desirable to reduce the voltage across memory array 10 by increasing $V_{ss\_array}$ and/or decreasing $V_{dd\_array}$ during the standby mode in order to reduce leakage current in memory array 10. In addition, the well voltages $V_{substrate}$ and $V_{n\text{-}well}$ may be controlled or maintained such that latch-up and cell upsets may be reduced or minimized during the active and/or standby modes.

Figure 4:
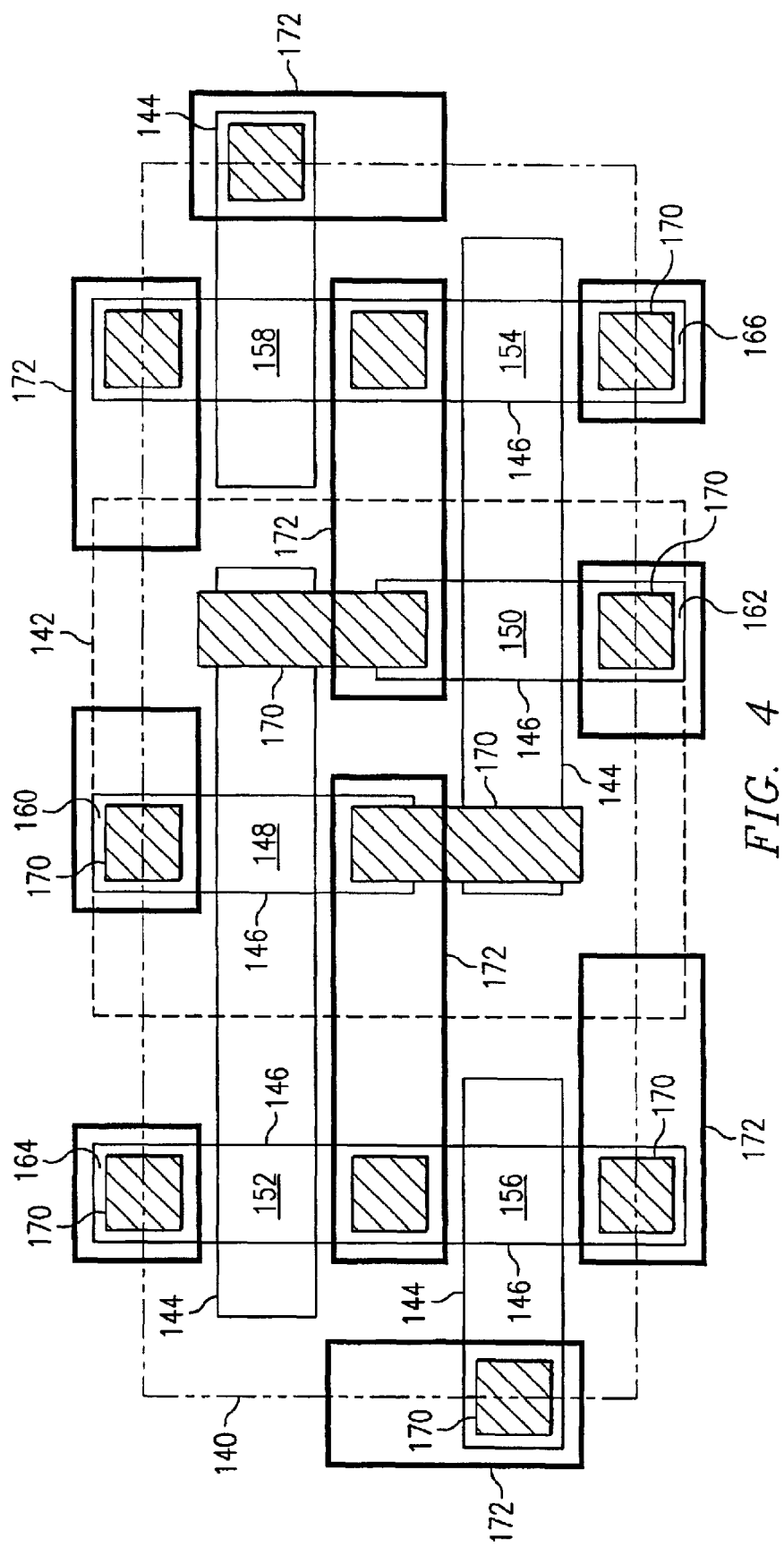
FIG. 4 is top plan view of a bit cell illustrating the substrate/well layer and a first conductive layer of the bit cell in accordance with an embodiment of the present invention.
Figure 4A:
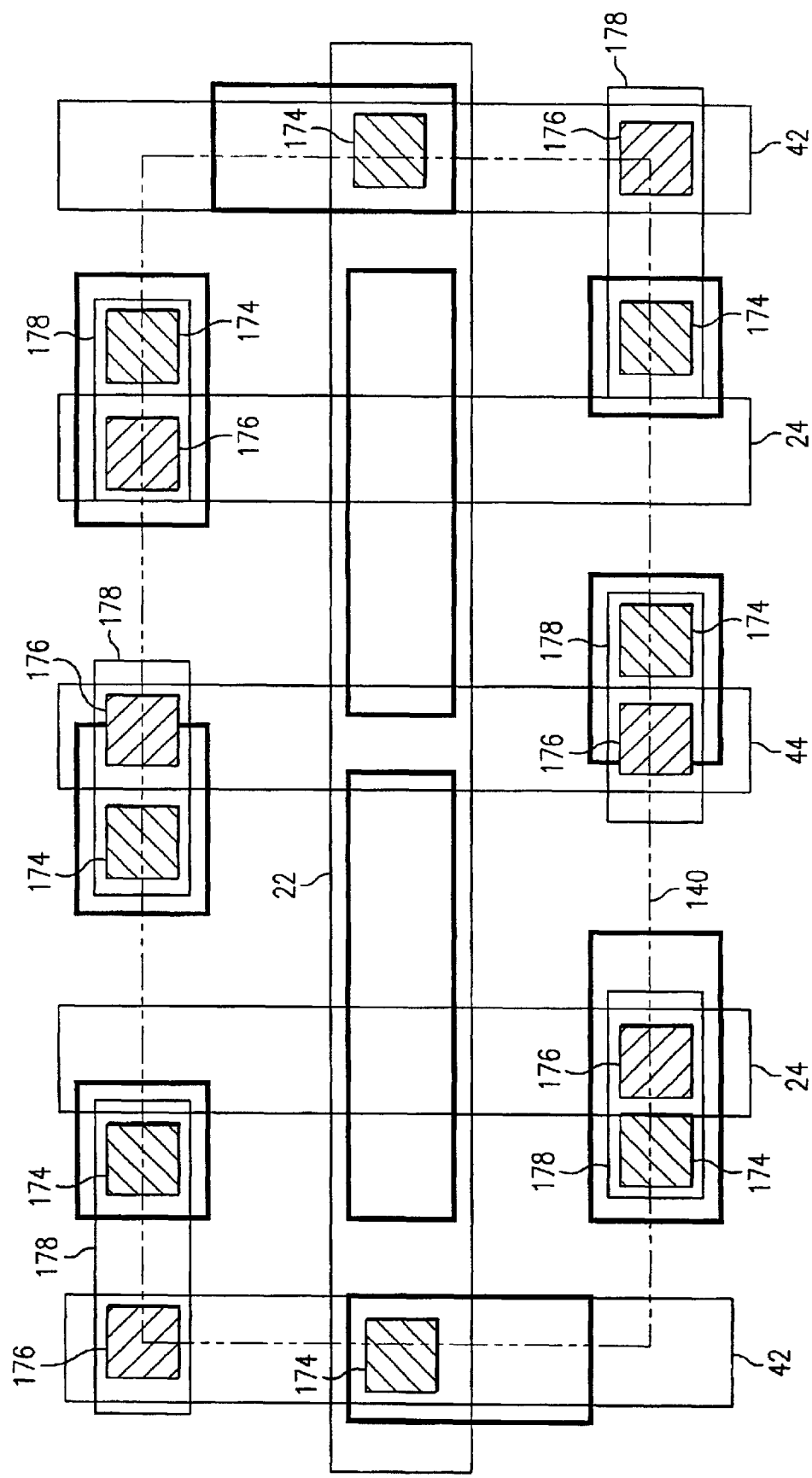
FIG. 4a is top plan view of the bit cell of FIG. 4 illustrating a second and third conductive layer of the bit cell in accordance with an embodiment of the present invention.

FIGS. 4 and 4a are top plan views illustrating various layers of bit cell 26 in accordance with an embodiment of the present invention. In particular, FIG. 4 illustrates a substrate/well layer and a first conductive, or metalization, layer of bit cell 26. Bit cell 26 shown in FIG. 4 is a six-transistor SRAM cell defined by a bit cell boundary 140 and includes n-well region 34 formed in substrate region 36. N-well region 34 is defined by n-well boundary 142.

Bit cell 26 includes several transistor gate poly lines 144 and several active regions 146. Each of six transistors is formed where one of the gate poly lines 144 crosses one of the active regions 146. The six transistors include two p-channel load transistors 148 and 150 formed in n-well region 34, two n-channel drive transistors 152 and 154 formed in substrate 36, and two n-channel pass-gate transistors 156 and 158 formed in substrate 36. Load transistors 148 and 150 include active source regions 160 and 162, respectively. Similarly, drive transistors 152 and 154 include active source regions 164 and 166, respectively. A plurality of contacts 170 connect various gate poly lines 144 and active regions 146 with each other and with a plurality of interconnects 172 disposed in a first conductive, or metalization, layer.

FIG. 4a illustrates the first conductive layer of bit cell 26 as shown in FIG. 4, along with a second and a third conductive, or metalization, layer. The first conductive layer may be connected to the second conductive layer by a plurality of first vias 174, and the second conductive layer may be connected to the third conductive layer by a plurality of second vias 176.

The second conductive layer may include word line 22 that couples pass-gate transistors 156 and 158 (which are shown in FIG. 4). The second conductive layer may also include one or more interconnects 178 used to route electrical currents in memory array 10. The third conductive layer may include one or more bit lines 24 coupled to pass-gate transistors 156 and 158 (which are shown in FIG. 4). Bit lines 24 receive output from the inverters formed by each pair of load and drive transistors (i.e., transistor pair 148 and 152, or 150 and 154).

The third conductive layer may include at least one low power supply line 42 and at least one high power supply line 44. FIGS. 4 and 4a, viewed together, illustrate that high power supply line 44 may be coupled (using contacts, vias and/or interconnects) to active source regions 160 and 162 of load transistors 148 and 150, respectively. Thus, high power supply line 44 can supply the high power voltage ($V_{dd\_array}$) to memory array 10. FIGS. 4 and 4a, viewed together, also illustrate that each low power supply line 42 may be coupled (using contacts, vias and/or interconnects) to active source regions 164 and 166 of drive transistors 152 and 154, respectively. Thus, low power supply line 42 can supply the low power voltage ($V_{ss\_array}$) to memory array 10. According to the embodiment shown in FIG. 4a, each low power supply line 42 runs along an edge of bit cell boundary 140 and is shared by two adjacent bit cells 26.

Figure 5:
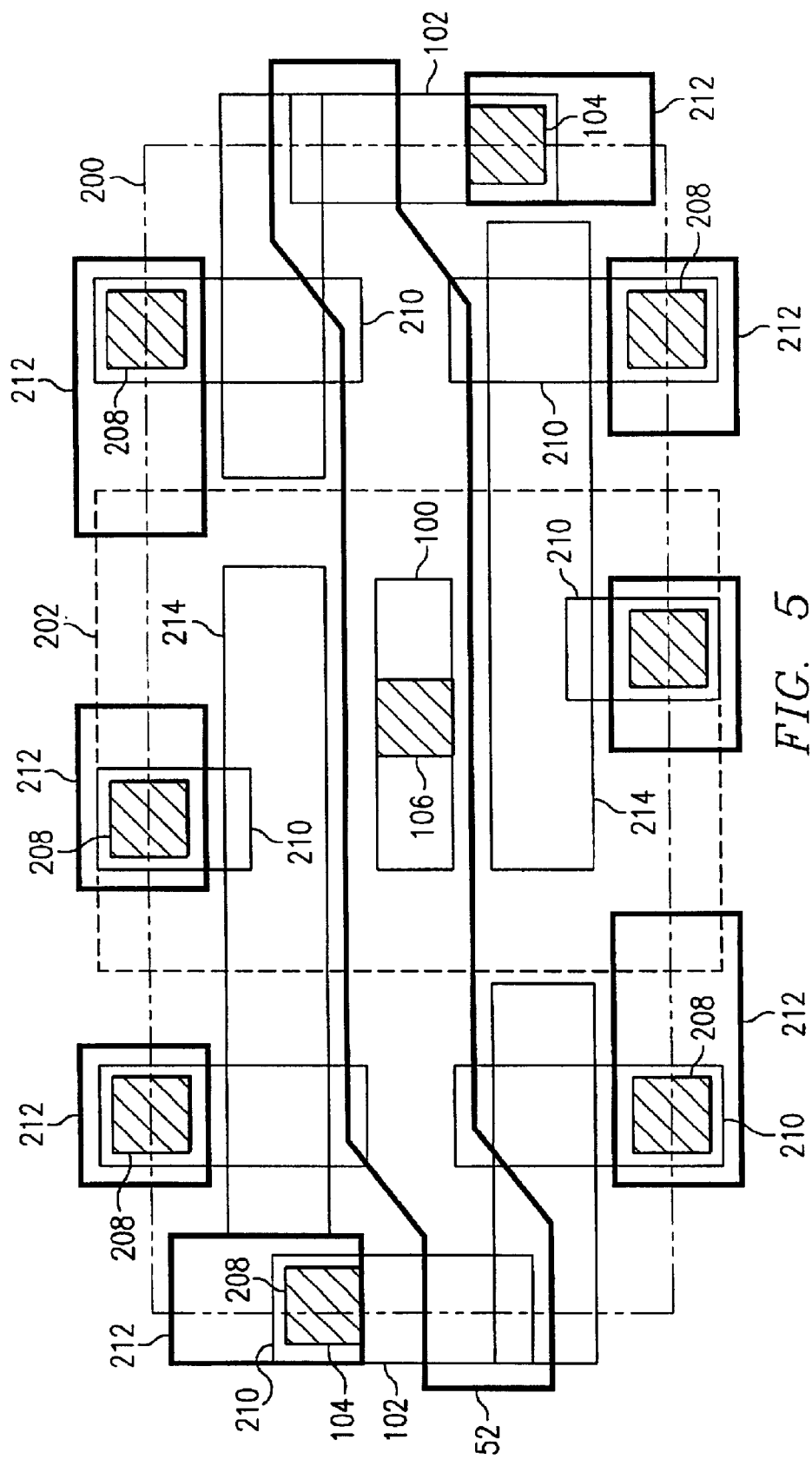
FIG. 5 is top plan view of a strap cell illustrating the substrate/well layer and a first conductive layer of the strap cell in accordance with an embodiment of the present invention.
Figure 5A:
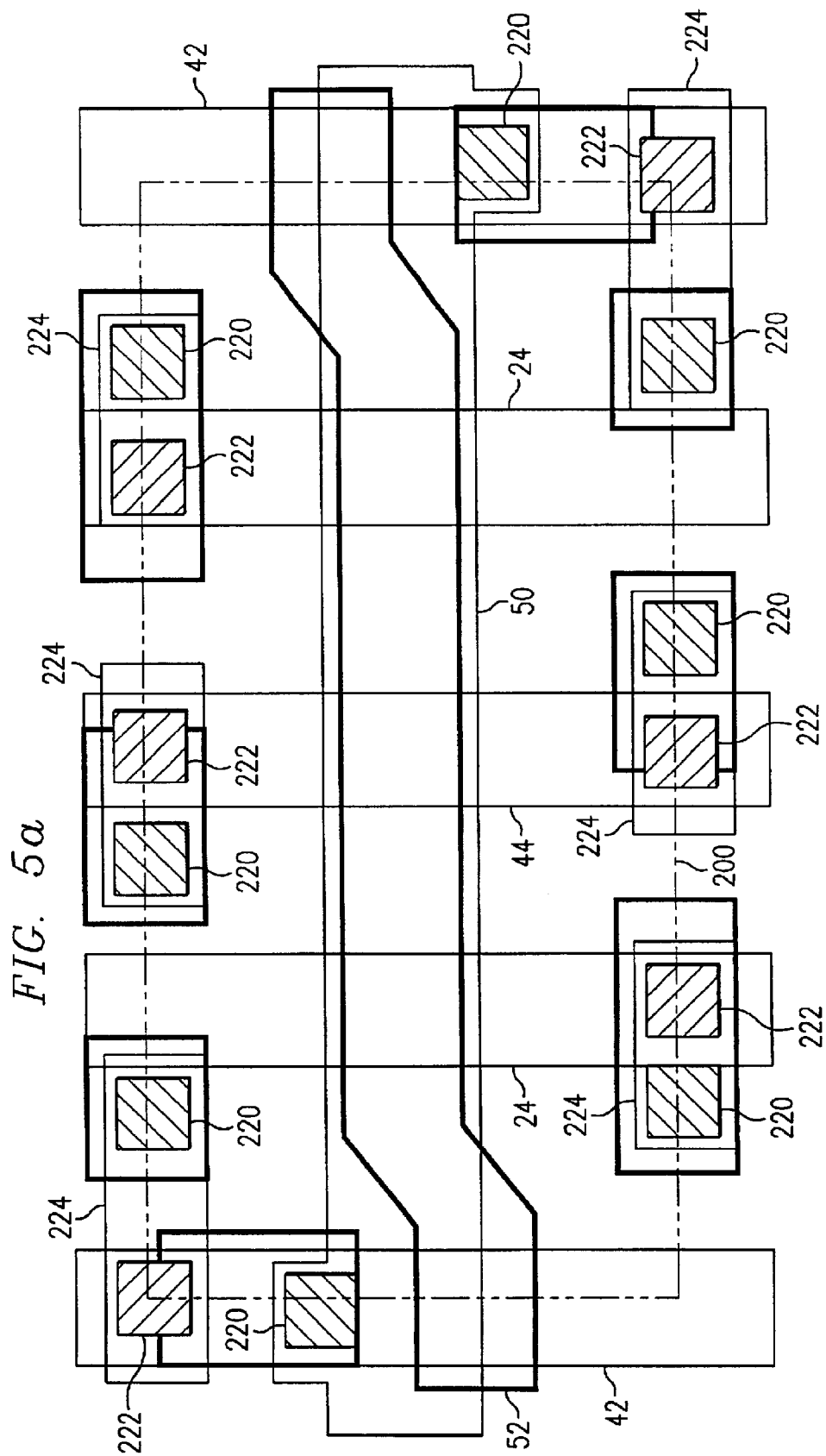
FIG. 5a is top plan view of the strap cell of FIG. 5 illustrating a second and third conductive layer of the strap cell in accordance with an embodiment of the present invention.

FIGS. 5 and 5a are top plan views illustrating various layers of strap cell 28 in accordance with an embodiment of the present invention. In particular, FIG. 5 illustrates a substrate/well layer and a first conductive, or metalization, layer of strap cell 28. Strap cell 28 is defined by strap cell boundary 200. As discussed above with reference to FIG. 3, strap cells 28 may "mimic" adjacent or nearby bit cells 26. For example, as shown in FIG. 5, strap cell 28 may include poly lines 214 similar to transistor gate poly lines 144 of bit cells 26 (see FIG. 4) even though strap cell 28 includes no functioning transistors. In addition, strap cell 28 may have a metal density substantially similar to the metal density of adjacent or nearby bit cells 26. Further, the height of strap cells 28 may be similar to that of adjacent or nearby bit cells 26. However, in some embodiments in which the height of strap cell 28 is not substantially similar to that of adjacent or nearby bit cells 26, the geometries of strap cell 28 and adjacent or nearby bit cells 26 are sufficiently similar to provide a similar environment for lithography and processing of the adjacent or nearby bit cells 26.

Strap cell 28 includes substrate region 46 and an n-well region 48 formed in substrate region 46. N-well region 48 is defined by n-well boundary 202. Strap cell 28 also includes the n-well contact region 100 and substrate contact regions 102, as discussed above with reference to FIG. 3. In the embodiment shown in FIG. 5, n-well contact region 100 and substrate contact regions 102 are active regions that are used as n-well and substrate contacts, respectively.

A plurality of contacts 208 connect various active regions 210 with a plurality of interconnects 212 disposed in a first conductive, or metalization, layer. Contacts 208 include substrate supply contacts 104 coupled to substrate contact regions 102 and an n-well supply contact 106 coupled to n-well contact region 100 (see FIG. 3 for additional reference).

In the embodiment shown in FIG. 5, n-well power supply line 52 is formed in the first conductive layer. In particular, n-well power supply line 52 may be formed by connecting conductive elements in the first conductive layer. N-well supply contact 106 electrically couples n-well contact region 100 with n-well power supply line 52. Further, n-well contact region 100 is electrically coupled to n-well region 48 (see FIG. 3), and n-well region 48 is coupled to n-well region 34 of bit cell 26 (see FIG. 1). Thus, n-well power supply line 52 may apply n-well voltage potential ($V_{n\text{-}well}$) to n-well region 34 of bit cell 26 via n-well supply contact 106 and n-well contact region 100.

FIG. 5a illustrates the first conductive layer of strap cell 28 as shown in FIG. 5, along with a second and a third conductive, or metalization, layer. The first conductive layer may be connected to the second conductive layer by a plurality of first vias 220 and the second conductive layer may be connected to the third conductive layer by a plurality of second vias 222.

The second conductive layer may include the substrate power supply line 50 and a plurality of second layer interconnects 224. Substrate power supply line 50 may be located generally where word line 22 is located with reference to bit cell 26 shown in FIGS. 4 and 4a. FIGS. 5 and 5a, viewed together, illustrate that substrate power supply line 50 may be coupled to substrate contact regions 102 by a combination of contacts, vias and/or interconnects, including substrate supply contacts 104. Further, substrate contact region 102 may be electrically coupled to substrate region 46, and substrate region 48 may be coupled to substrate region 36 of bit cell 26 shown in FIGS. 4 and 4a. Thus, substrate power supply line 50 can apply substrate voltage potential ($V_{substrate}$) to substrate region 36 of bit cell 26 via substrate supply contacts 104 and substrate contact regions 102.

Like the third conductive layer of bit cell 26, the third conductive layer of strap cell 28 may include bit lines 24 and low and high power supply lines 42 and 44. Thus, bit lines 24 and power supply lines 42 and 44 may run above or through both bit cells 26 and strap cells 28 of a particular cell column 16. Other techniques or cell configurations may be used to conduct $V_{n\text{-}well}$ and/or $V_{substrate}$ to the n-well and substrate regions. For example, in one embodiment the strap cell includes a conductive interconnect line similar to the word lines in nearby bit cells, wherein the interconnect line may be used to apply an n-well voltage potential ($V_{n\text{-}well}$) to the n-well region of the strap cell and adjacent bit cells. In another embodiment, the strap cell has a greater height than nearby bit cells and comprises two conductive interconnect lines similar to the word lines in nearby bit cells, wherein one of the two interconnect lines conducts an n-well voltage potential ($V_{n\text{-}well}$) to the n-well region and the other conducts a substrate voltage potential ($V_{substrate}$) to the substrate region.

FIG. 6 illustrates a method of reducing leakage current in a memory array in accordance with an embodiment of the present invention. At step 250, a memory array, such as for example memory array 10, comprising a bit cell and a strap cell is provided. The memory array may be an array of RAM, SRAM, ROM, PROM, EPROM, EPROM/Flash, or DRAM cells, or any other type of memory array without departing from the present invention. In one embodiment, the memory array is a six-transistor SRAM array.

The memory array may comprise a plurality of bit cell rows and a plurality of strap cell rows disposed in the memory array at regular intervals. In particular, the memory array may comprise a strap cell row disposed at every 64 to 72 rows of the memory array, as discussed above with respect to FIG. 1. The bit cell may comprise an n-well region disposed in a substrate region. The n-well region may be formed from n-type silicon, and the substrate region may be formed from p-type silicon. The bit cell may further comprise a p-channel transistor disposed in the n-well region and an n-channel transistor disposed in the substrate region. Each transistor may include an active source region and an active drain region. Like the bit cell, the strap cell may comprise an n-well region disposed in a substrate region. In addition, the strap cell may "mimic," or have a geometry similar to, the bit cell, as described above regarding strap cell 28 and bit cell 26 with reference to FIG. 1.

At step 252, a high power voltage potential ($V_{dd\_array}$) is applied to an active region of the p-channel transistor. At step 254, a low power voltage potential ($V_{ss\_array}$) is applied to an active region of the n-channel transistor. In one embodiment, $V_{dd\_array}$ is applied to the source region of the p-channel transistor and $V_{ss\_array}$ is applied to the source region of the n-channel transistor.

At step 256, an n-well voltage potential ($V_{n\text{-}well}$) is applied to the n-well region of the bit cell via the n-well region of the strap cell. In one embodiment in which the n-well regions of the strap cell and bit cell are conductively coupled, $V_{n\text{-}well}$ is applied to the n-well region of the strap cell and propagates to the n-well region of the bit cell. In one embodiment, $V_{n\text{-}well}$ is greater than $V_{dd\_array}$ which creates a back bias on the p-channel transistor, thereby increasing the threshold voltage ($V_{th}$) of the p-channel transistor and reducing the leakage current of the memory array. In a particular embodiment, $V_{n\text{-}well}$ is greater than $V_{dd\_array}$ when the bit cell (or memory array) is in a standby mode, but not when the bit cell is in an active mode. In another embodiment, $V_{n\text{-}well}$ is greater than $V_{dd\_array}$ during the standby mode and the active mode of the bit cell (or memory array). In another embodiment, the memory cell is disposed in a peripheral circuit, such as a logic circuit, and $V_{n\text{-}well}$ is substantially the same as the high power supply voltage applied to the peripheral circuit $V_{dd\_peripheral}$.

At step 258, a substrate voltage potential ($V_{substrate}$) is applied to the substrate region of the bit cell via the substrate of the strap cell. In one embodiment in which the substrate regions of the strap cell and bit cell are conductively coupled, $V_{substrate}$ is applied to the substrate region of the strap cell and propagates to the substrate region of the bit cell. In one embodiment, $V_{substrate}$ is less than $V_{ss\_array}$ which creates a back bias on the n-channel transistor, thereby increasing the threshold voltage ($V_{th}$) of the n-channel transistor and reducing the leakage current of the memory array. In a particular embodiment, $V_{substrate}$ is less than $V_{ss\_array}$ when the bit cell (or memory array) is in a standby mode, but not when the bit cell is in an active mode. In another embodiment, $V_{substrate}$ is less than $V_{ss\_array}$ during the standby mode and the active mode of the bit cell (or memory array). In another embodiment, the memory cell is disposed in a peripheral circuit, such as a logic circuit, and $V_{substrate}$ is substantially the same as the low power supply voltage applied to the peripheral circuit, $V_{ss\_peripheral}$. It should be noted that the various voltages ($V_{ss\_array}$, $V_{dd\_array}$, $V_{ss\_peripheral}$, $V_{dd\_peripheral}$, $V_{substrate}$, and $V_{n\text{-}well}$) may be otherwise related, for example as described above with respect to FIGS. 1–3, without departing from the scope of the present invention. It should also be noted that in some embodiments only one of $V_{substrate}$ or $V_{n\text{-}well}$ is applied to bit cells 26. Also, in some embodiments, only one of $V_{substrate}$ or $V_{n\text{-}well}$ is separate from $V_{ss\_array}$ and $V_{dd\_array}$, respectively.

At step 260, one or more of the voltages $V_{ss\_array}$, $V_{dd\_array}$, $V_{n\text{-}well}$ and $V_{substrate}$ are controlled in order to achieve desired relationships between the voltages during one more modes of the bit cell (or memory array), such as a standby mode and an active mode. One or more of the various voltages ($V_{ss\_array}$, $V_{dd\_array}$, $V_{substrate}$, and $V_{n\text{-}well}$) may be controlled using a controller, such as for example controller 54 discussed with reference to FIG. 1. In addition, the various voltages may be controlled in any suitable way for reducing leakage current in the memory array, for example as described above with respect to FIGS. 1–3, without departing from the scope of the present invention.

Although an embodiment of the invention and its advantages are described in detail, a person skilled in the art could make various alternations, additions, and omissions without departing from the spirit and scope of the present invention as defined by the appended claims.

What is claimed is:

1. A memory array comprising:
    a bit cell row comprising bit cell, the bit cell comprising a first transistor disposed in a first bit cell body region, the first transistor including a first active source region;
    a strap cell row comprising a strap cell, the strap cell comprising a first strap cell body region conductively coupled to the first bit cell body region;
    a first power supply line electrically coupled to the first active source region and providing a first supply voltage potential to the first active source region; and
    a first offset supply line electrically coupled to the first strap cell body region and providing a first offset voltage potential to the first bit cell body region via the first strap cell body region, wherein the first supply voltage potential is operable to be different from the first offset voltage potential.

2. The memo array of claim 1, wherein the first supply voltage potential is operable to be different from the first offset voltage potential in a standby mode of the bit cell.

3. The memory array of claim 2, wherein the first supply voltage potential is substantially the same as the first offset voltage potential in an active mode of the bit cell.

4. The memory array of claim 1, wherein the difference between the first offset voltage potential and the first supply voltage potential is operable to be controlled such that the difference is greater in a standby mode of the bit cell than in an active mode of the bit cell.

5. The memory array of claim 1, wherein the first transistor is an n-channel transistor, wherein the first bit cell body region is a p-type substrate, wherein the first offset voltage potential is a substrate voltage potential, wherein the first supply voltage potential is a second power supply voltage, and wherein the first supply voltage potential is operable to be greater than the first offset voltage potential.

6. The memory array of claim 5, wherein the memory array is coupled to a peripheral circuit, wherein the peripheral circuit has a second power supply voltage potential, and wherein the first supply voltage potential of the memory array is operable to be greater than the second power supply voltage potential of the peripheral circuit.

7. The memory array of claim 1, wherein the first transistor is a p-channel transistor, wherein the first bit cell body region is an n-well region, wherein the first offset voltage potential is an n-well voltage potential, wherein the first supply voltage potential is a third power supply voltage, and wherein the first supply voltage potential is operable to be less than the first offset voltage potential.

8. The memory array of claim 7, wherein the memory array is a coupled to a peripheral circuit, wherein the peripheral circuit has a third power supply voltage potential, and wherein the first supply voltage potential of the memory array is operable to be less than the third power supply voltage potential of the peripheral circuit.

9. The memory array of claim 1, wherein the bit cell comprises a bit cell geometry and the strap cell comprises a strap cell geometry substantially similar to the bit cell geometry.

10. The memory array of claim 1, wherein the bit cell further comprises a second transistor disposed in an n-well region, the n-well region extending generally along a first direction, and wherein the memory array further comprises a bit line electrically coupled to the first transistor and extending generally along the first direction.

11. The memory array of claim 1, wherein the memory array is a static random access memory array.

12. The memory array of claim 1, wherein the bit cell is a six-transistor static random access memory cell.

13. The memory array of claim 1, wherein the memory array further comprises a conductive layer and a word line formed in the conductive layer and electrically coupled to the bit cell, and wherein the first offset supply line is formed in the conductive layer.

14. The memory array of claim 1, wherein the first supply voltage potential may be controlled separately from the first offset voltage potential.

15. The memory array of claim 1, wherein the bit cell further comprises a second transistor disposed in a second bit cell body region, the second transistor including a second active region; wherein the strap cell further comprises a second strap cell body region conductively coupled to the second bit cell body region; and wherein the memory array further comprises:
    a second power supply line electrically coupled to the second active region and providing a second supply voltage potential to the second active region; and
    a second offset supply line electrically coupled to the second strap cell body region and providing a second offset voltage potential to the second bit cell body region via the second strap cell body region, wherein the second supply voltage potential is operable to be different than the second offset voltage potential.

16. The memory array of claim 15, wherein the first transistor is a p-channel transistor, wherein the first bit cell body region is an n-well region, wherein the first offset voltage potential is an n-well voltage potential, and wherein the first supply voltage potential is operable to be less than the first offset voltage potential; and wherein the second transistor is an n-channel transistor, wherein the second bit cell body region is a p-type substrate, wherein the second offset voltage potential is a substrate voltage potential, and wherein the second supply voltage potential is operable to be greater than the second set voltage potential.

17. The memory array of claim 16, wherein the memory array is a coupled to a peripheral circuit, the peripheral circuit having a fourth power supply voltage potential and a fifth power supply voltage potential; and wherein the first offset voltage potential is substantially the same as the fifth power supply voltage potential of the peripheral circuit and the second offset voltage potential is substantially the same as the fourth power supply voltage potential of the peripheral circuit.

18. The memory array of claim 15, wherein the memory array further comprises a first conductive layer, a second conductive layer, and a word line electrically coupled to the bit cell, and wherein the first offset supply line is formed in the first conductive layer and the second offset supply line and the word line are formed in the second conductive layer.

19. The memory array of claim 18, the memory array further comprises a third conductive layer and a bit line electrically coupled to the bit cell, wherein the first power supply line, the second power supply line, and the bit line are formed in the third conductive layer.

20. A method of reducing memory array leakage current, the method comprising:
providing a memory array comprising a bit cell and a strap cell, wherein the bit cell comprises a first transistor disposed in a first bit cell body region, the first transistor including a first active source region, and wherein the strap cell comprises a first strap cell body region conductively coupled to the first bit cell body region;
applying a first supply voltage potential to the first active source region; and
applying a first offset voltage potential to the first bit cell body region via the first strap cell body region, wherein the first supply voltage potential is operable to be different from the first offset voltage potential.

21. The method of claim 20, wherein the first supply voltage potential is operable to be different from the first offset voltage potential in a standby mode of the bit cell.

22. The method of claim 21, wherein the first supply voltage potential is substantially the same as the first offset voltage potential in an active mode of the bit cell.

23. The method of claim 20, further comprising controlling the first offset voltage potential such that the difference between the first offset voltage potential and the first supply voltage potential is greater in a standby mode of the bit cell than in an active mode of the bit cell.

24. The method of claim 20, further comprising controlling the first supply voltage potential such that the difference between first offset voltage potential and the first supply voltage potential is greater in a standby mode of the bit cell than in an active mode of the bit cell.

25. The method of claim 20, wherein the first transistor is an n-channel transistor, wherein the first bit cell body region is a p-type substrate, wherein the first offset voltage potential is a substrate voltage potential, and wherein the first supply voltage potential is operable to be greater than the first offset voltage potential.

26. The method of claim 20, wherein the first transistor is a p-channel transistor, wherein the first bit cell body region is an n-well region, wherein the first offset voltage potential is an n-well voltage potential, and wherein the first supply voltage potential is operable to be less than the first offset voltage potential.

27. The method of claim 20, wherein the bit cell comprises a bit cell geometry and the strap cell comprises a strap cell geometry substantially similar to the bit cell geometry.

28. The method of claim 20, wherein the memory array is a static random access memory array.

29. The method of claim 20, wherein the bit cell further comprises a second transistor disposed in a second bit cell body region, the second bit cell including a second active source region; wherein the strap cell further comprises a second strap cell body region conductively coupled to the second bit cell body region, and wherein the method further comprises:
applying a second supply voltage potential to the second active source region; and
applying a second offset voltage potential to the second body region via the second strap cell body region, wherein the second supply voltage potential is operable to be different than the second offset voltage potential.

30. The method of claim 29, wherein the first transistor is a p-channel transistor, wherein the first bit cell body region is an n-well region, wherein the first offset voltage potential is an n-well voltage potential, and wherein the first supply voltage potential is operable to be less than the first offset voltage potential; and wherein the second transistor is an n-channel transistor, wherein the second bit cell body region is a p-type substrate, wherein the second offset voltage potential is a substrate voltage potential, and wherein the second supply voltage potential is operable to be greater than the second offset voltage potential.

31. A memory array strap cell comprising:
a first strap cell body region comprising a well region and operable to be coupled to a first bit cell body region of a it cell comprising a first transistor including a first active source region disposed in the first bit cell body region; and
a first conductive contact coupled to the first strap cell body region;
wherein the memory array strap cell is operable to communicate a first offset voltage potential from a first offset supply line to the first bit cell body region via the first conductive contact and the first trap cell body region; and
wherein the first offset voltage potential is operable to be different from a first supply voltage potential received by the first active source region from a first power supply line.

32. The memory array strap cell of claim 31, wherein the first supply voltage potential is operable to be different from the first offset voltage potential in a standby mode of the bit cell.

33. The memory array strap cell of claim 32, wherein the first supply voltage potential is substantially the same as the first offset voltage potential in an active mode of the bit cell.

34. The memory array strap cell of claim 31, wherein the difference between the first offset voltage potential and the first supply voltage potential is operable to be controlled such that the difference is greater in a standby mode of the bit cell than in an active mode the bit cell.

35. The memory array strap cell of claim 31, wherein the strap cell comprises a strap cell geometry substantially similar to a geometry of the bit cell.

36. The memory array strap cell of claim 31, wherein the strap cell is a component of a logic circuit, wherein the logic circuit has a logic circuit supply voltage potential, and wherein the first supply voltage potential is substantially the same as the logic circuit supply voltage potential.

* * * * *